United States Patent
Adams

(10) Patent No.: US 6,777,959 B2
(45) Date of Patent: Aug. 17, 2004

(54) METHOD OF DETERMINING A RESISTIVE CURRENT

(75) Inventor: Jerry F. Adams, Westport, NY (US)

(73) Assignee: Xerox Corporation, Stamford, CT (US)

( * ) Notice: Subject to any disclaimer, the term of this patent is extended or adjusted under 35 U.S.C. 154(b) by 16 days.

(21) Appl. No.: 10/355,564

(22) Filed: Jan. 30, 2003

(65) Prior Publication Data

US 2003/0115002 A1 Jun. 19, 2003

Related U.S. Application Data

(63) Continuation-in-part of application No. 09/886,766, filed on Jun. 21, 2001, now abandoned.

(51) Int. Cl.$^7$ .......................... G01R 27/08; H01T 19/00
(52) U.S. Cl. ........................................ 324/691; 250/324
(58) Field of Search ................................ 324/691, 649, 324/600, 650, 658, 659, 679, 76.12, 76.11; 399/50, 89; 250/324, 325, 326; 361/229, 235

(56) References Cited

U.S. PATENT DOCUMENTS

| | | | | |
|---|---|---|---|---|
| 3,908,164 A | * | 9/1975 | Parker | 323/265 |
| 4,087,838 A | * | 5/1978 | Masaki et al. | 358/475 |
| 5,206,600 A | * | 4/1993 | Moehlmann | 324/650 |
| 6,034,368 A | * | 3/2000 | Song et al. | 250/324 |

\* cited by examiner

*Primary Examiner*—N. Le
*Assistant Examiner*—Hoai-An D. Nguyen
(74) *Attorney, Agent, or Firm*—Wayne J. Egan; Michael A. Butler

(57) ABSTRACT

A xerographic charging device corona current is determined by forming a first signal across a sense resistor in series with the charging device power supply, forming a second signal using a resistive voltage divider network across the power supply, and forming a third signal using a resistor-capacitor charging circuit across the power supply, and then processing the first, second and third signals to form an output signal that is based on the corona current.

31 Claims, 11 Drawing Sheets a third signal 203. The FIG. 2 first, second and third signals 201–203 are then input to a processor 300.

FIG. 3 depicts the FIG. 2 processor 300 in greater detail. As shown, the processor 300 includes a phase detector 310.

FIG. 4 depicts the FIG. 3 phase detector 310 and the identical FIG. 6 phase detector 610.

FIG. 5 depicts an input signal 510 and the FIG. 1 load 100 arranged to form a first signal 501, a second signal 502 and a third signal 503. The FIG. 5 first, second and third signals 501–503 are then input to a processor 600.

FIG. 6 depicts the FIG. 5 processor 600 in greater detail. As shown, the processor 600 includes a phase detector 610.

FIG. 7 depicts one embodiment of the FIG. 3 summing circuit 330 and the FIG. 6 summing circuit 630.

FIG. 8 depicts one embodiment of the FIG. 4 first comparator 411 and second comparator 412.

FIG. 9 depicts one embodiment of the FIG. 4 amplifier 440.

FIG. 10 depicts one embodiment of the FIG. 6 low-pass filter 640.

FIG. 11 depicts one embodiment of the FIG. 3 buffer amplifier 340, the FIG. 5 buffer amplifier 570, and the FIG. 6 buffer amplifier 650.

FIG. 12 depicts an input signal 1210 and the FIG. 1 load 100 arranged to form a first signal 1201, a second signal 1202 and a third signal 1203. As shown, FIG. 12 includes a first subtraction circuit 1206 and a second subtraction circuit 1207.

FIG. 13 depicts one embodiment of the FIG. 12 first subtraction circuit 1206 and the second subtraction circuit 1207.

DETAILED DESCRIPTION OF THE INVENTION

Briefly, a xerographic charging device corona current is determined by forming a first signal across a sense resistor in series with the charging device power supply, forming a second signal using a resistive voltage divider network across the power supply, and forming a third signal using a resistor-capacitor charging circuit across the power supply, and then processing the first, second and third signals to form an output signal that is based on the corona current.

Referring to FIG. 1, there is depicted an input signal 10 arranged to drive a load 100, the load comprising a resistive current, $I_R$, and a capacitive current, $I_X$. In one embodiment, the load 100 comprises a xerographic charging device and the resistive current, $I_R$, comprises the corona charging current. In FIG. 1 the input signal 10 generally depicts a sinusoidal signal 210 as discussed in FIG. 2 below, a non-sinusoidal signal 510 as discussed in FIG. 5 below, or both.

Referring to FIG. 2, there is depicted the input signal 210, comprising a sinusoidal input signal of frequency $f_0$, and the FIG. 1 load 100 arranged for determining the resistive current, $I_R$.

A first signal 201 is formed based on a sense resistor 220 ($R_S$) coupled in series with the input signal 210. This first signal 201 is substantially in-phase with and proportional to the sum of the resistive current, $I_R$, and the capacitive current, $I_X$.

A second signal 202 is formed based on a resistive voltage-divider network comprising resistor 230 ($R_1$) and resistor 240 ($R_2$) coupled from the input signal 210 to ground 101. This second signal 202 is in-phase with the input signal 210.

METHOD OF DETERMINING A RESISTIVE CURRENT

CROSS-REFERENCE TO RELATED APPLICATIONS

This is a continuation-in-part of commonly-assigned prior application Ser. No. 09/886,766, filed Jun. 21, 2001 now abandoned by Jerry F. Adams, the same inventor as in the present application, the disclosure of which prior application is hereby incorporated by reference verbatim, with the same effect as though such disclosure were fully and completely set forth herein.

TECHNICAL FIELD

This invention relates to a method of determining a resistive current and more particularly to a method of determining a corona current in a xerographic charging device.

BACKGROUND OF THE INVENTION

There are many applications where a load current includes both a resistive current component and a capacitive current component. In some applications it is desirable to measure both the resistive component and the capacitive current component where the resistance, capacitance, or both, are unknown or varying.

One such application is a xerographic charging device driven by an AC power supply. Here the load current is the corona current, which comprises both a resistive component and also a parasitic capacitive component. If the resistive and capacitive current components can be measured without knowledge of the absolute or relative values of either the resistance or capacitance of the load, the information can be used to control the AC power supply to ensure improved corona charging performance.

SUMMARY OF THE INVENTION

In one embodiment, a load current comprises a resistive current and a capacitive current. The load is driven by a sinusoidal input signal. The resistive current is determined by forming a first signal that is substantially in-phase with and proportional to the sum of the resistive current and the capacitive current; forming a second signal in-phase with the input signal; forming a third signal opposite in phase to the capacitive current; and processing the first, second and third signals to form a result based on the resistive current.

In a further embodiment, a load current comprises a resistive current and a capacitive current. The load is driven by an input signal. The resistive current is determined by forming a first signal in-phase with and proportional to the sum at all frequencies comprised in the input signal of the resistive current and the capacitive current; forming a second signal in-phase with the input signal; forming a third signal proportional to the capacitive current at all frequencies comprised in the input signal; and processing the first, second and third signals to form a result based on the resistive current.

Figure 2:
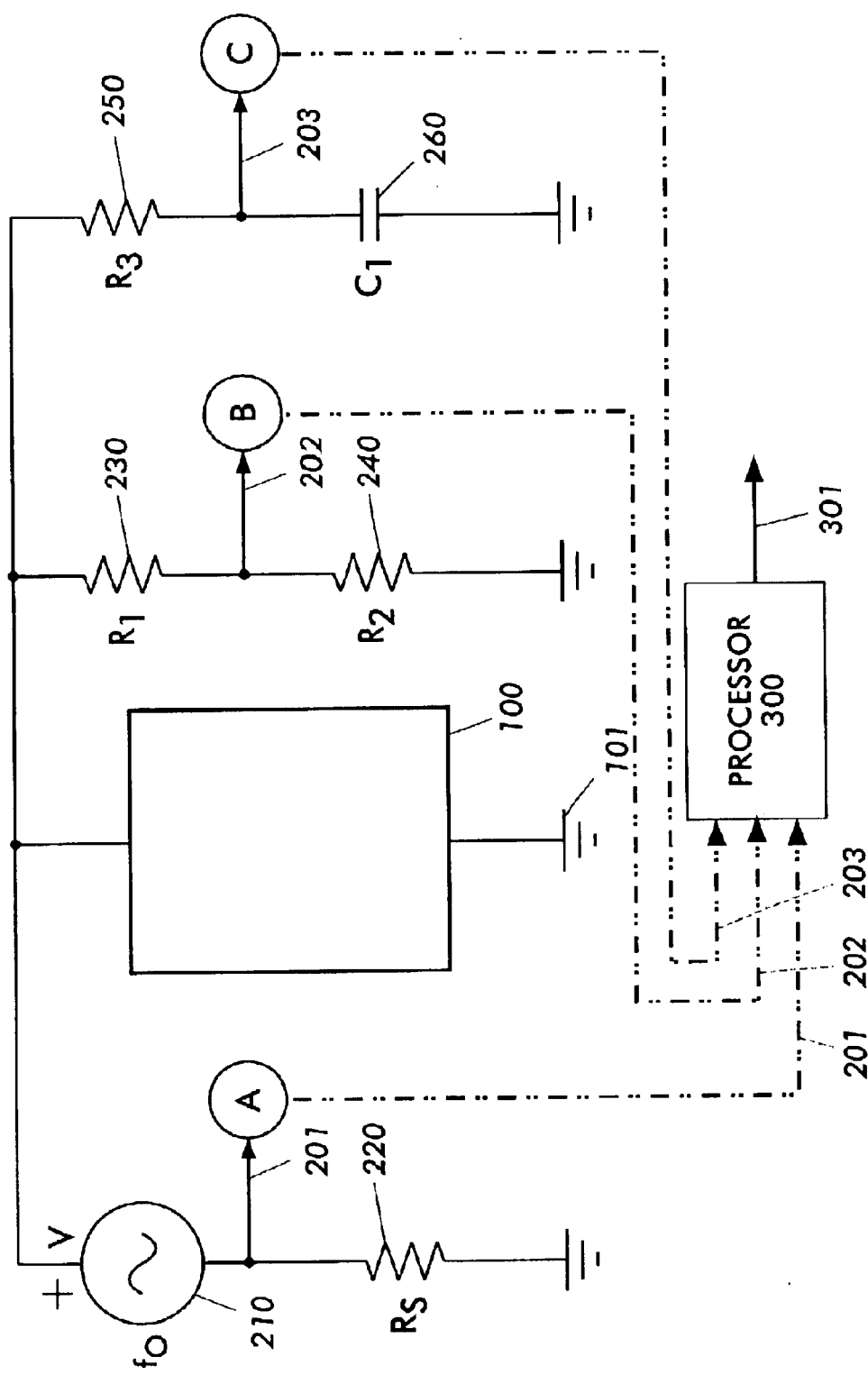
FIG. 2 depicts an input signal 210 and the FIG. 1 load 100 arranged to form a first signal 201, a second signal 202 and A third signal 203 is formed based on a resistor-capacitor network comprising resistor 250 ($R_3$) and capacitor 260 ($C_1$) coupled from the input signal 210 to ground 101. This third signal 203 is opposite in phase to the capacitive current, $I_X$.

The FIG. 2 first, second and third signals 201–203 are then input to a processor 300 which forms a first result 301 that is proportional to the resistive current, $I_R$.

In One Embodiment:

The input signal 210 comprises a sinusoidal signal of magnitude of 6 Kilo volts RMS at a frequency ($f_0$) of 4 KHz.

The load resistance $R_L$, comprising the load charging device 100 corona charging resistance, comprises 500 K-Ohms.

The load capacitance $C_L$, comprising the load charging device 100 parasitic capacitance, comprises 10 pF.

The sense resistor, $R_S$, comprises 100 ohms, which is much less than $R_L$.

The resistor $R_1$ is 10 Meg-Ohms, and the resistor $R_2$ is 10 K-Ohms. Thus, the sum of resistor $R_1$ and resistor $R_2$ is much greater than $R_L$.

Also, the ratio of resistor $R_1$ to resistor $R_2$ provides an acceptable level of the second signal 202 to provide an input to the processor 300.

The resistor $R_3$ is 5 Meg-Ohms, which is much greater than $R_L$.

The capacitor $C_1$ is 100 pF, which is greater than $1/(2\pi R_3 f_0)$.

Figure 3:
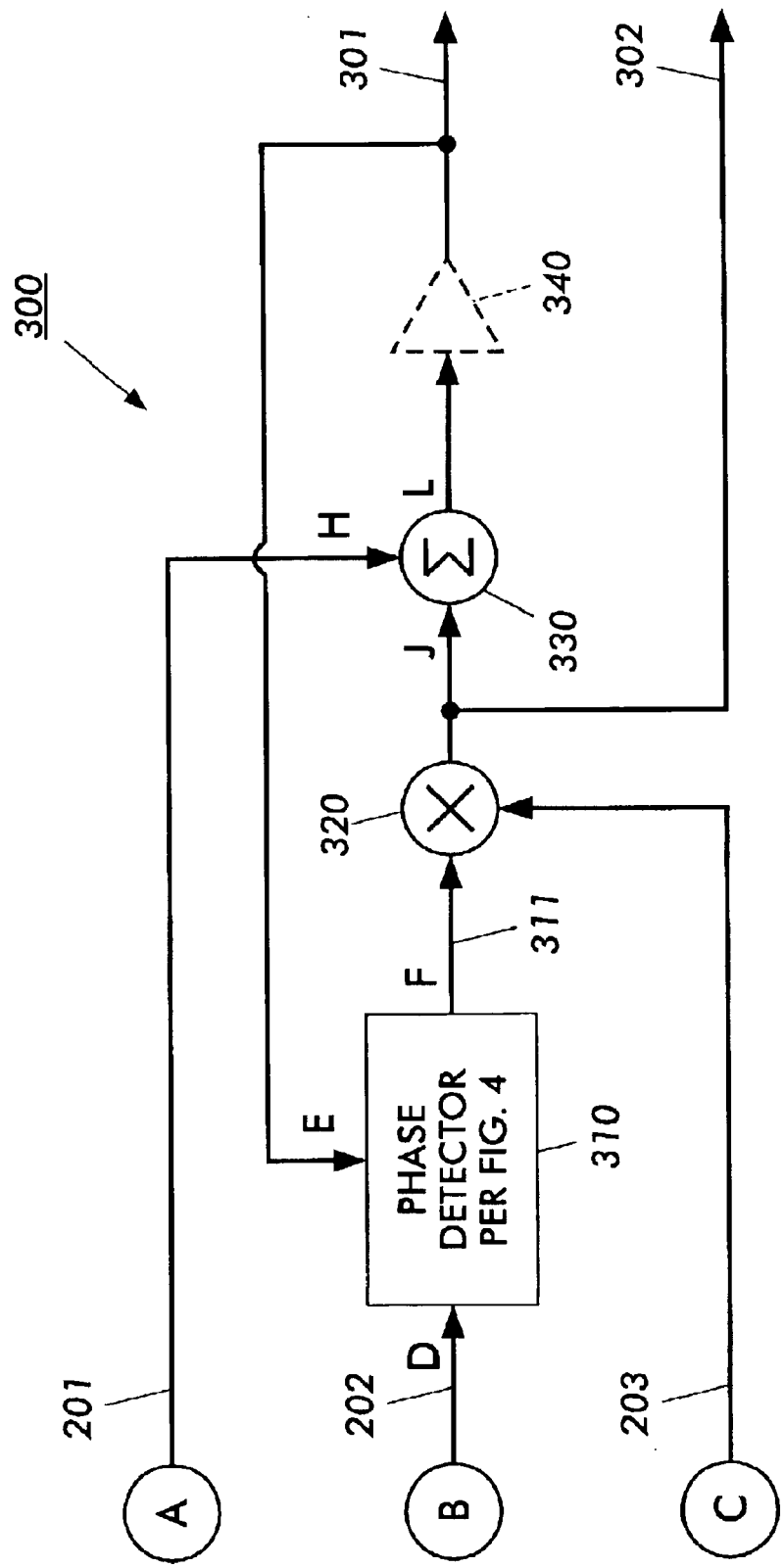

Refer now to FIG. 3. As depicted therein, the FIG. 2 processor 300 comprises a phase detector 310, a multiplier 320 and a summing circuit 330, with the FIG. 2 first, second and third signals 201–203 coupled as shown. The FIG. 3 phase detector 310 forms an intermediate result 311 based on the phase difference between the first result 301 and the second signal 202. The intermediate result 311 and the third signal 203 are then multiplied by the multiplier 320 to form a FIG. 3 second result 302 that is proportional to the capacitive current, $I_X$. The summing circuit 330 then sums the first signal 201 and the second result 302 to form the FIG. 3 first result 301.

In one embodiment, the FIG. 3 first result 301 is equal in volts to the resistive current ($I_R$) times the sense resistor ($R_S$).

In one embodiment, the FIG. 3 second result 302 is equal in volts to the capacitive current ($I_X$) times the sense resistor ($R_S$).

The FIG. 3 phase detector 310 is depicted in greater detail in FIG. 4, which is discussed below.

Still referring to FIG. 3, in one embodiment, the multiplier 320 comprises an analog four-quadrant multiplier IC, such as, for example, the Analog Devices part number AD532, available from Analog Devices, One Technology Way, Norwood, Mass. 02062, whose web site address is: www.analog.com.

Figure 7:
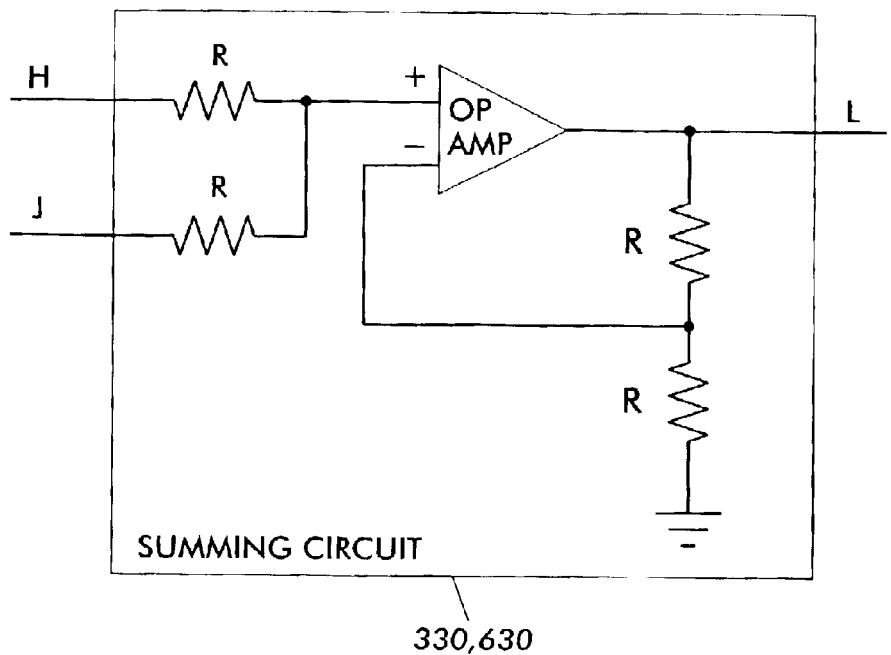

The FIG. 3 summing circuit 330, for example, may comprise the summing circuit that is depicted in FIG. 7.

Figure 11:
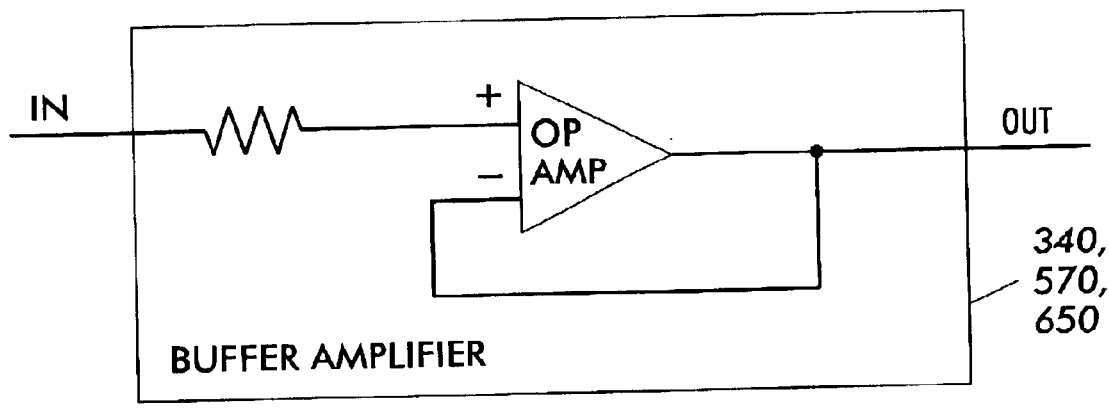

Still referring to FIG. 3, in one embodiment, a unity-gain buffer amplifier 340, depicted in broken lines, is coupled in series with the summing circuit 330 output. The FIG. 3 buffer amplifier 340, for example, may comprise the buffer amplifier that is depicted in FIG. 11.

Figure 4:
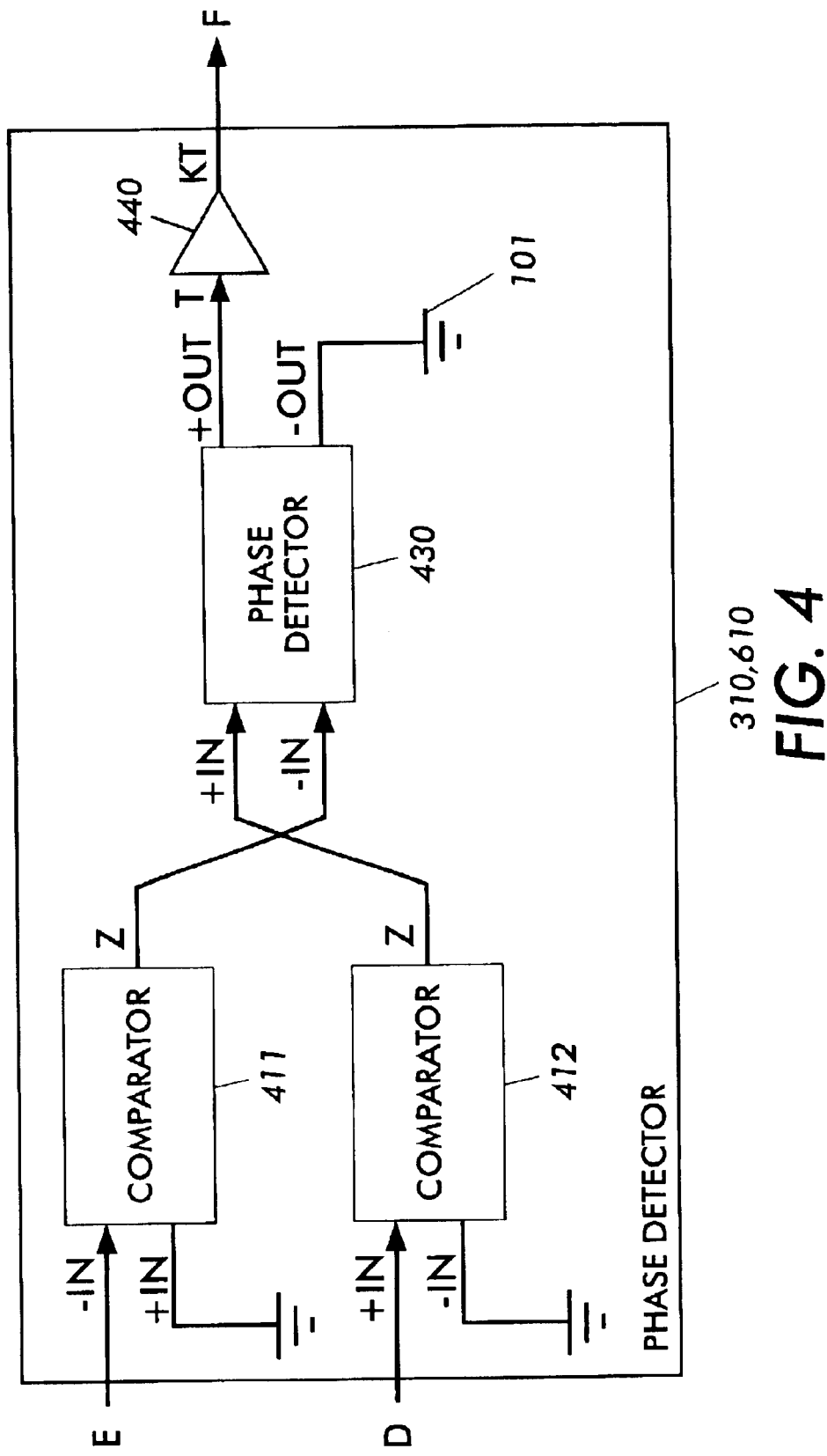
Figure 6:
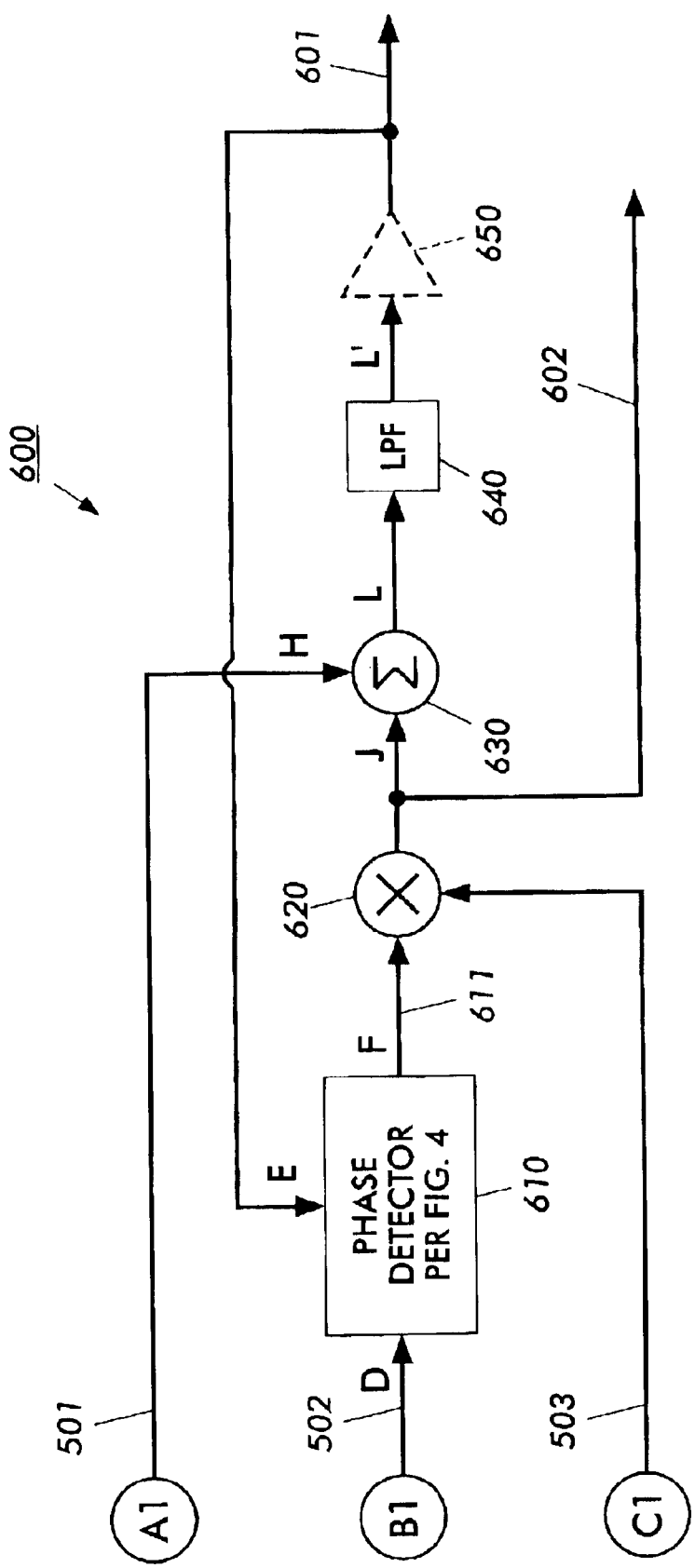

Referring now to FIG. 4, there is depicted the FIG. 3 phase detector 310 and the identical FIG. 6 phase detector 610.

Still referring to FIG. 4, as depicted therein, the detector 310 comprises a first comparator 411, a second comparator 412, a phase detector 430 and an amplifier 440. The amplifier 440 has a gain of K.

Figure 8:
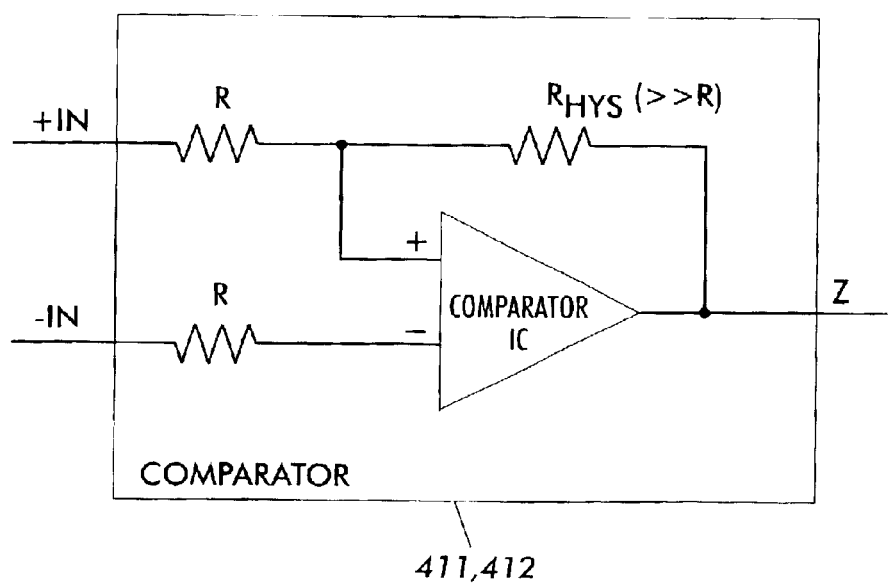

Each comparator of the FIG. 4 first comparator 411 and second comparator 412, for example, may comprise the comparator that is depicted in FIG. 8.

In one embodiment, the FIG. 4 phase detector 430 comprises a phase detector IC such as, for example, the National Semiconductor part number 74C932, available from National Semiconductor, 2900 Semiconductor Drive, Santa Clara, Calif. 95052, whose web site is: www.national.com.

Figure 9:
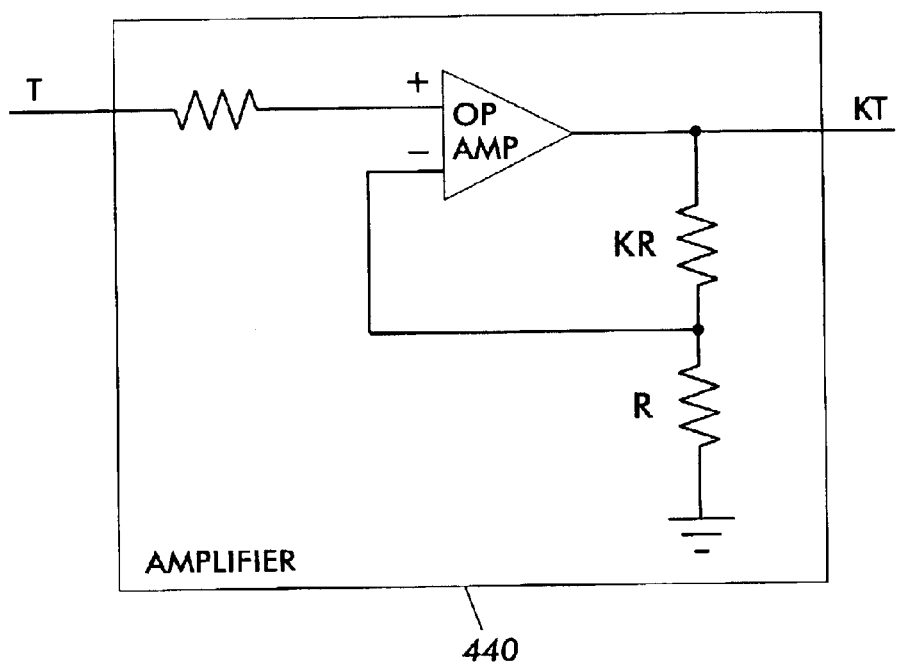

The FIG. 4 amplifier 440, for example, may comprise the amplifier circuit that is depicted in FIG. 9.

In one embodiment, the accuracy of the FIG. 3 first result 301 as a measure of the resistive current, $I_R$, is based on the value of the FIG. 4 amplifier 440's gain, K. As well, the accuracy of the FIG. 3 second result 302 as a measure of the capacitive current, $I_X$, likewise is based on the value of the FIG. 4 amplifier 440's gain, K. Generally, K equals the inverse of the desired accuracy. For example, for 1% accuracy, then K equals the inverse of 1%, or 1/.01, thus K equals 100. As another example, for 0.1% accuracy, then K equals the inverse of 0.1%, or 1/.001, thus K equals 1000.

Figure 1:
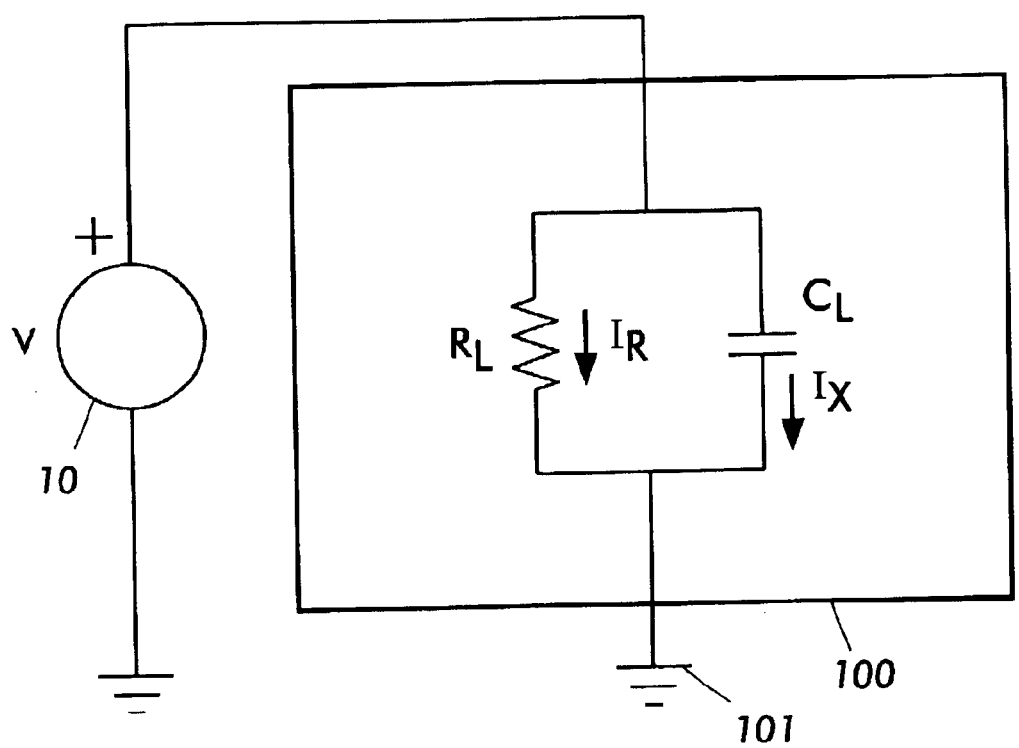
FIG. 1 depicts an input signal 10 arranged to drive a load 100, the load 100 comprising a resistive current, $I_R$, and a capacitive current, $I_X$.
Figure 5:
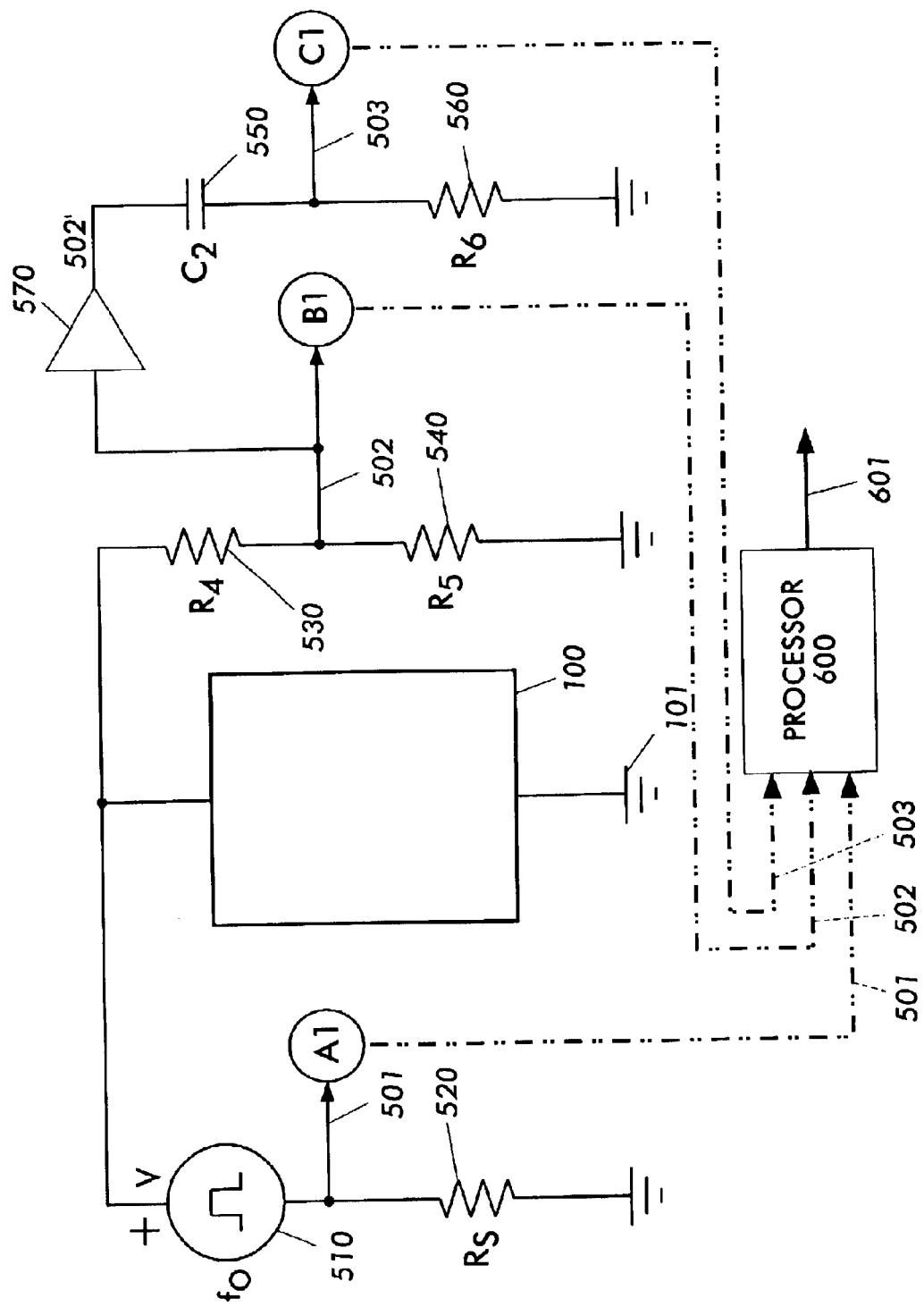

Referring to FIG. 5, there is depicted the input signal 510, comprising a non-sinusoidal input signal of frequency $f_0$, and the FIG. 1 load 100 arranged for determining the resistive current, $I_R$.

In one embodiment, for example, the input signal 510 comprises a square wave.

A first signal 501 is formed based on a sense resistor ($R_S$) 520 coupled in series with the input signal 510. This FIG. 5 first signal 501 is in-phase with and proportional to the sum at all frequencies comprised in the input signal 510 of the resistive current, $I_R$, and the capacitive current, $I_X$.

A second signal 202 is formed based on a resistive voltage-divider network comprising resistor 530 ($R_4$) and resistor 540 ($R_5$) coupled from the input signal 510 to ground 101. This FIG. 5 second signal 502 is in-phase with the input signal 510.

A third signal 503 is formed based on a capacitor-resistor network comprising capacitor 550 ($C_2$) and resistor 560 ($R_6$) coupled from the second signal 502 to ground 101. A unity-gain buffer amplifier 570 is coupled in series with the second signal 502. The FIG. 5 buffer amplifier 570, for example, may comprise the buffer amplifier that is depicted in FIG. 11.

The FIG. 5 third signal 503 is proportional to the capacitive current, $I_X$, at all frequencies comprised in the input signal 510.

The FIG. 5 first, second and third signals 501–503 are then input to a processor 600 which forms a first result 601 that is proportional to the resistive current, $I_R$.

In One Embodiment:

The input signal 510 comprises a non-sinusoidal signal of magnitude of 6 Kilo volts RMS at a frequency ($f_0$) of 4 KHz.

The load resistance $R_L$, comprising the load charging device 100 corona charging resistance, comprises 500 K-Ohms.

The load capacitance $C_L$, representing the load charging device 100 parasitic capacitance, comprises 10 pF.

The sense resistor, $R_S$, comprises 100 ohms, which is much less than $R_L$.

The resistor $R_4$ is 10 Meg-Ohms, and the resistor $R_5$ is 10 K-Ohms. Thus, the sum of resistor $R_4$ and resistor $R_5$ is much greater than $R_L$. Also, the ratio of resistor R4 to $R_5$ provides an acceptable level of the second signal 502 to be used as input to the processor 600.

The resistor $R_6$ is 100 K-Ohms.

The capacitor $C_2$ is 0.001 micro-F.

Referring to FIG. 6, as depicted therein, the FIG. 5 processor 600 comprises a phase detector 610, a multiplier 620, a summing circuit 630 and a low-pass filter 640, with the FIG. 5 first, second and third signals 501–503 coupled as shown. The phase detector 610 forms an intermediate result 611 based on the phase difference between the first result 601 and the second signal 502. The intermediate result 611 and the third signal 503 are then multiplied by the multiplier 620 to form a FIG. 6 second result 602 that is proportional to the capacitive current, $I_X$. The summing circuit 630 then sums the first signal 501 and the second result 602 to form a sum L. The sum L is then filtered by the low-pass filter 640 to form a filtered output L', and ultimately the FIG. 6 first result 601.

In one embodiment, the FIG. 6 first result 601 is equal in volts to the resistive current ($I_R$) times the sense resistor ($R_S$).

In one embodiment, the FIG. 6 second result 602 is equal in volts to the capacitive current ($I_X$) times the sense resistor ($R_S$).

Still referring to FIG. 6, the phase detector 610 is depicted in greater detail in FIG. 4, which is discussed above.

As discussed above in connection with the FIG. 4-depicted phase detector 610, it will be understood the phase detector 610 comprises an amplifier 440 with a gain of K. In one embodiment, the accuracy of the FIG. 6 first result 601 as a measure of the resistive current, $I_R$, is based on the value of K. As well, the accuracy of the FIG. 6 second result 602 as a measure of the capacitive current, $I_X$, likewise is based on the value of K. Generally, K equals the inverse of the desired accuracy.

Still referring to FIG. 6, in one embodiment, the multiplier 620 comprises an analog four-quadrant multiplier IC, such as, for example, the Analog Devices part number AD532.

The FIG. 6 summing circuit 630, for example, may comprise the summing circuit that is depicted in FIG. 7.

Figure 10:
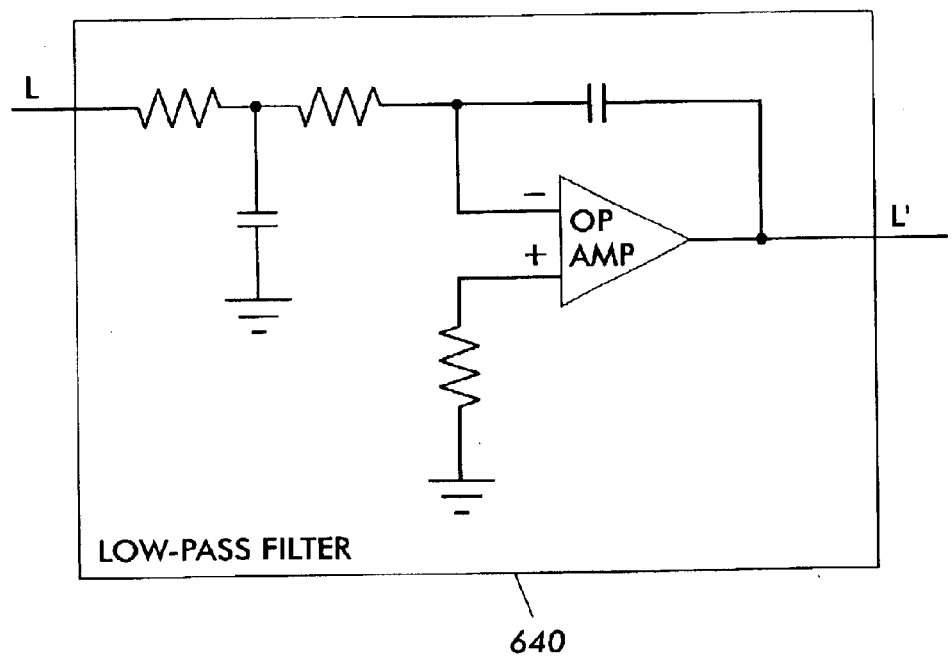

In one embodiment, the FIG. 6 low-pass filter 640 has a cut-off frequency equal to 10 times $f_0$. The FIG. 6 low-pass filter 640, for example, may comprise the low-pass filter that is depicted in FIG. 10.

Still referring to FIG. 6, in one embodiment, a unity-gain buffer amplifier 650, depicted in broken lines, is coupled in series with the low-pass filter 640 output L'. The FIG. 6 buffer amplifier 650, for example, may comprise the buffer amplifier that is depicted in FIG. 11.

Referring to FIG. 7, there is depicted a typical summing circuit that, for example, may comprise the FIG. 3 summing circuit 330 and the FIG. 6 summing circuit 630. The FIG. 7-depicted Op Amp is a typical Op Amp IC such as, for example, the Maxim part number MAX400 available from Maxim Dallas Semiconductors, 120 San Gabriel Drive, Sunnyvale, Calif. 94086, whose web site is: www.maxim-ic.com.

Referring to FIG. 8, there is depicted a typical comparator that, for example, may comprise the FIG. 4 first comparator 411 and the second comparator 412. The FIG. 8-depicted comparator IC is a typical analog comparator IC such as, for example, the National Semiconductor part number LM311 available from National Semiconductor. Note the value of the hysteresis resistor ($R_{HYS}$) is much greater than the value of either input resistor R.

Referring to FIG. 9, there is depicted a typical amplifier circuit that, for example, may comprise the FIG. 4 amplifier circuit 440. The FIG. 9-depicted Op Amp is a typical OP Amp IC such as, for example, the Maxim part number MAX 400.

Referring to FIG. 10, there is depicted a typical low-pass filter that, for example, may comprise the FIG. 6 low-pass filter 640. The FIG. 10-depicted Op Amp is a typical OP Amp IC such as, for example, the Maxim part number MAX 400. It is well-known to select the FIG. 10-depicted resistor and capacitor values to achieve the designed filter performance.

Referring to FIG. 11, there is depicted a typical buffer amplifier that, for example, may comprise the FIG. 3 buffer amplifier 340, the FIG. 5 buffer amplifier 570, and the FIG. 6 buffer amplifier 650. The FIG. 11-depicted Op Amp is a typical OP Amp IC such as, for example, the Maxim part number MAX 400.

Further embodiments of a method of determining a resistive current, in accordance with the present invention, are now described.

In one embodiment, there is described a method of determining a resistive current of a load, the load comprising a capacitive current, the load driven by an input signal, the input signal being sinusoidal, the method comprising:

(a) forming a first signal in-phase with and proportional to the sum of the resistive current and the capacitive current;

(b) forming a second signal in-phase with the input signal;

(c) forming a third signal opposite in phase to the capacitive current; and (d) processing the first, second and third signals to form a first result based on the resistive current, wherein:

the first signal is based on a sense resistor in series with the input signal;

the second signal is based on a difference between the first signal and a first ratio signal, the first ratio signal being formed by a resistive divider network coupled between the input signal and the first signal; and the third signal is based on a difference between the first signal and a second ratio signal, the second ratio signal being formed by a resistor-capacitor divider network coupled between the input signal and the first signal, and wherein:

the resistance of the sense resistor is much less than the load resistance;

the resistive divider network comprises a first resistor and a series-connected second resistor and the resistance sum of the first resistor and the second resistor is much greater than the load resistance; and the resistor-capacitor divider network comprises a third resistor and a series-connected capacitor and the resistance of the third resistor is much greater than the load resistance.

Referring again to FIG. 2, in an alternate embodiment, $R_S$ (reference 220) is 100 Ohms, $R_1$ (reference 230) is 10 Meg-Ohms, $R_2$ (reference 240) is 10 K-Ohms, $R_3$ (reference 250) is 50 Meg-Ohms and $C_1$ (reference 260) is 1000 pF, which is equal to $1 \times 10^{-9}$ F or 1 nano-Farad ("nF").

Figure 12:
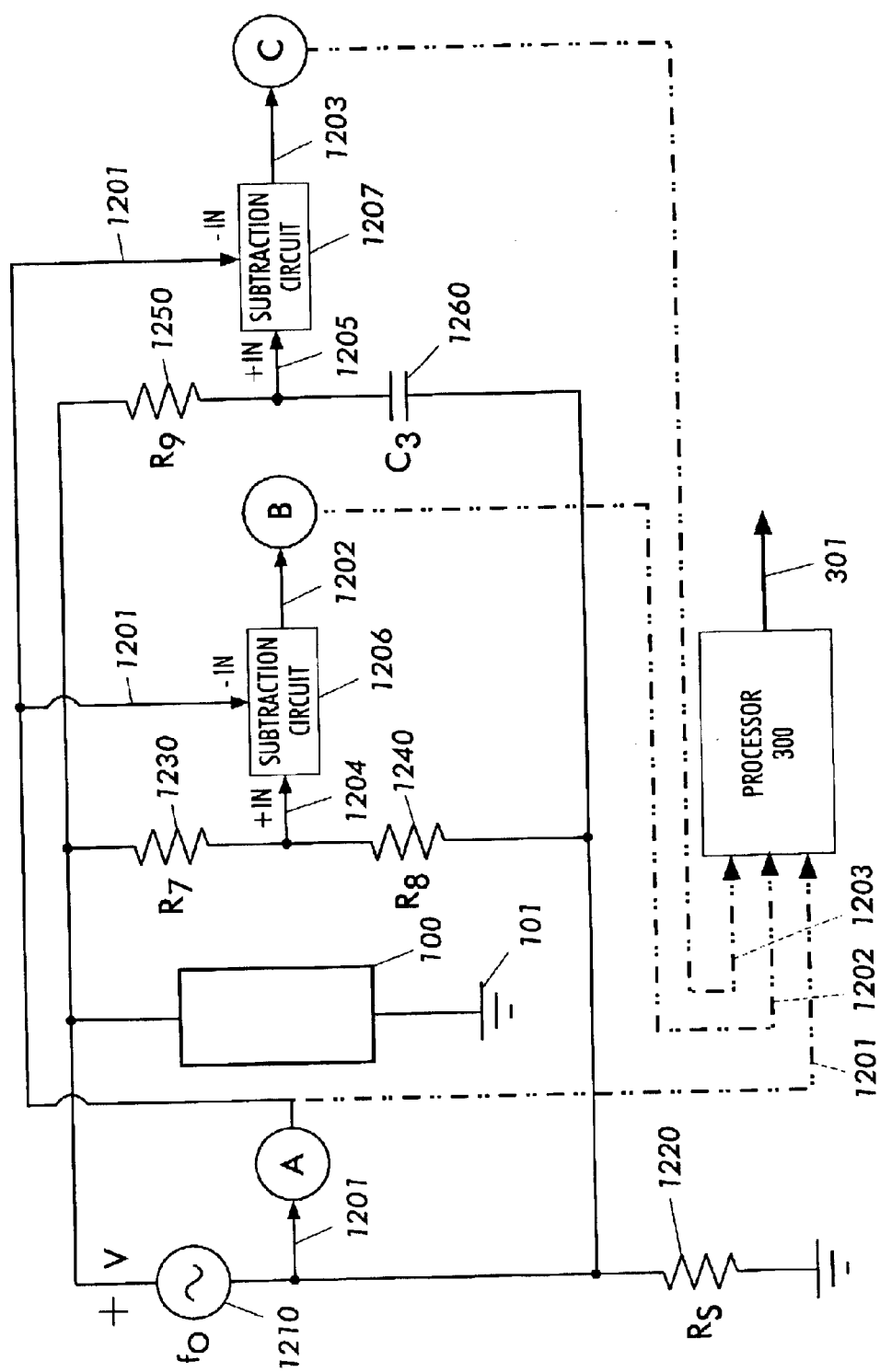

Returning to the drawing, there is also included a FIG. 12 and a FIG. 13, which figures are briefly described as follows:

FIG. 12 depicts an input signal 1210 and the FIG. 1 load 100 arranged to form a first signal 1201, a second signal 1202 and a third signal 1203. The FIG. 12 first, second and third signals 1201–1203 are then input to the processor 300, which has been described above in connection with FIG. 3. As shown, the FIG. 12 includes a first subtraction circuit 1206 and a second subtraction circuit 1207.

Figure 13:
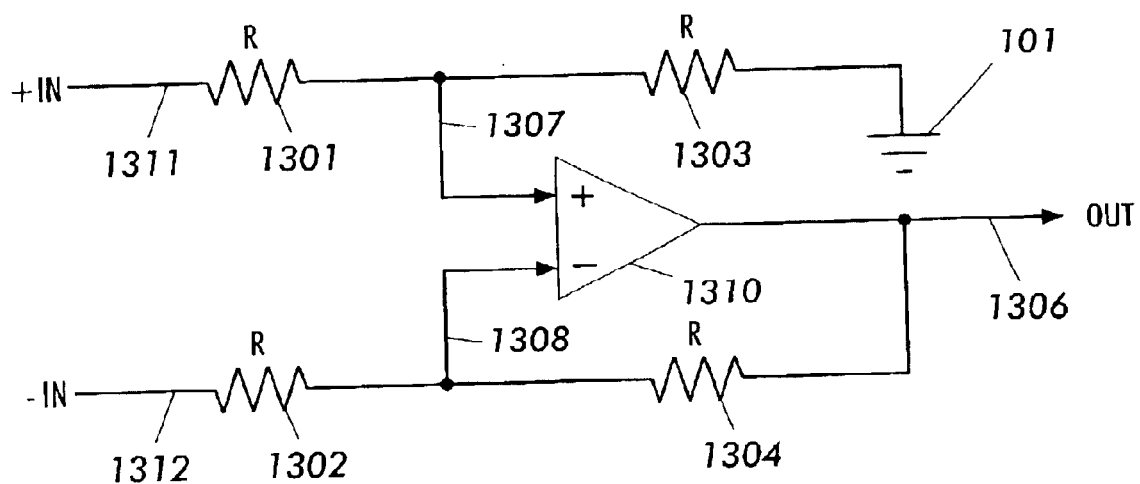

FIG. 13 depicts one embodiment of the FIG. 12 first subtraction circuit 1206 and the second subtraction circuit 1207.

Referring now to FIG. 12, there is depicted an input signal 1210 comprising a sinusoidal input signal of frequency $f_0$, and the FIG. 1 load 100 arranged for determining the resistive current, $I_R$.

A first signal 1201 is formed in-phase with and proportional to the sum of the resistive current, $I_R$ and the capacitive current, $I_X$.

A second signal 1202 is formed in-phase with the input signal 1210.

A third signal 1203 is formed opposite in phase to the capacitive current, $I_X$.

The first signal 1201, the second signal 1202 and the third signal 1203 are then input to a processor 300 which is identical to the processor 300 that is discussed above in connection with FIGS. 3–4. As discussed in connection with FIG. 3 above, the processor 300 forms a first result 301 that is proportional to the resistive current, $I_R$.

As shown in FIG. 12, the first signal 1201 is based on a sense resistor 1220 ($R_S$) in series with the input signal, 1210.

Also as shown, the second signal 1202 is based on a difference between the first signal 1201 and a first ratio signal 1204, the first ratio signal 1204 being formed by a resistive divider network (1230, 1240) coupled between the input signal 1210 and the first signal 1201.

Also as shown, the third signal 1203 is based on a difference between the first signal 1201 and a second ratio signal 1205, the second ratio signal 1205 being formed by a resistor-capacitor divider network (1250, 1260) coupled between the input signal 1210 and the first signal 1201.

As shown, the resistive divider network (1230, 1240) comprises a first resistor 1230 ($R_7$) and a series-connected second resistor 1240 ($R_8$), and the resistor-capacitor divider network (1250, 1260) comprises a third resistor 1250 ($R_g$) and a series-connected capacitor 1260 ($C_3$).

In accordance with the present invention, the resistance of the sense resistor 1220 ($R_S$) is much less than the load resistance, $R_L$; the resistance sum of the first resistor 1230 ($R_7$) and the second resistor 1240 ($R_8$) is much greater than the load resistance, $R_L$; and the resistance of the third resistor 1250 ($R_9$) is much greater than the load resistance, $R_L$.

As mentioned above, the first, second and third signals 1201–1203 are then processed by the processor 300 as depicted in FIGS. 3–4. Referring back to these FIGS. 3–4, and as described above in connection with these same FIGS., the first result 301 is in-phase with and proportional to the resistive current, IR.

Also as described above, the processor 300 forms an intermediate result 311 based on the phase difference between the first result 301 and the second signal 1202.

Also in the processor 300, the intermediate result 311 and the third signal 1203 are then multiplied by the multiplier 320 to form the second result 302 that is proportional to the capacitive current $I_X$. The summing circuit 330 then sums the first signal 1201 and the second result 302 to form the first result 301.

Still referring to FIG. 12, in one embodiment the resistive current $I_R$ comprises a charging device corona current.

In One Embodiment:

The input signal 1210 comprises a sinusoidal signal of magnitude of 6 Kilo volts RMS at a frequency ($f_0$) of 4 KHz.

The load resistance $R_L$, comprising the load charging device 100 corona charging resistance, comprises 500 K-Ohms.

The load capacitance $C_L$, comprising the load charging device 100 parasitic capacitance, comprises 10 pF.

The sense resistor 1220 ($R_S$) has a resistance of 100 Ohms, the resistance of the first resistor 1230 ($R_7$) is 10 Meg-Ohms, the resistance of the second resistor 1240 ($R_8$) is 10 K-Ohms, the resistance of the third resistor 1250 ($R_g$) is 50 Meg-Ohms and the capacitance of the capacitor 1260 ($C_3$) is 1000 pF, which is equal to $1 \times 10^{-9}$ F or 1 nF.

Referring now to FIG. 13, there is depicted one embodiment of the FIG. 12 subtraction circuit 1206 and the FIG. 12 subtraction circuit 1207.

Still referring to FIG. 13, there is depicted an Op Amp 1310. The FIG. 13-depicted Op Amp is a typical OP Amp IC such as, for example, the Maxim part number MAX 400. A first intermediate signal 1307, derived from the input signal 1311 and the first resistor network comprising resistor 1301 and resistor 1303, is applied to the non-inverting input of the operational amplifier 1301. A second intermediate signal 1308, derived from the input signal 1312 and the second resistor network comprised of resistor 1302 and resistor 1304, is applied to the inverting input of the operational amplifier 1310. The resultant output signal 1306 is proportional to input signal 1312 subtracted from input signal 1311. Each of the resistors 1301–1304 has the same resistance value. In one embodiment, resistors 1301–1304 each have a resistance of 10 K ohms.

While various embodiments of a method of determining a resistive current, in accordance with the present invention, have been disclosed hereinabove, the scope of the invention is defined by the following claims.

What is claimed is:

1. A method of determining a resistive current of a toad comprising a load resistance and a load capacitance, the toad further comprising a capacitive current, the load driven by an input signal, the input signal being sinusoidal, the method comprising:

(a) forming a first signal substantially in-phase with and proportional to the sum of the resistive current and the capacitive current;

(b) forming a second signal in-phase with the input signal;

(c) forming a third signal opposite in phase to the capacitive current; and (d) processing the first, second and third signals to form a first result based on the resistive current, the first result being in-phase with and proportional to the resistive current, the processing including forming an intermediate result based on the phase difference between the first result and the second signal, wherein:
  the first signal is based on a sense resistor in series with the input signal;
  the second signal is based on a resistive network coupled to the input signal and ground; and
  the third signal is based on a resistor-capacitor network coupled to the input signal and ground,
and wherein:
  the resistance of the sense resistor is much less than the load resistance;
  the resistive network comprises a first resistor and a series-connected second resistor and the resistance sum of the first resistor and the second resistor is much greater than the load resistance; and the resistor-capacitor network comprises a third resistor and the resistance of the third resistor is much greater than the load resistance.

2. The method of claim 1, the processing including multiplying the intermediate result and the third signal to form a second result based on the capacitive current.

3. The method of claim 2, the second result being proportional to the capacitive current.

4. The method of claim 2, the first result based on summing the first signal and the second result.

5. The method of claim 4, the sense resistor having a resistance of 100 Ohms.

6. The method of claim 4, first resistor having a resistance of 10 Meg-Ohms.

7. The method of claim 4, the third resistor having a resistance of 5 Meg-Ohms.

8. The method of claim 1, the resistive current comprising a charging device corona current.

9. A method of determining a resistive current of a load, the load further comprising a capacitive current, the load driven by an input signal, the method comprising:
(a) forming a first signal in-phase with and proportional to the sum at all frequencies comprised in the input signal of the resistive current and the capacitive current;
(b) forming a second signal in-phase with the input signal;
(c) forming a third signal proportional to the capacitive current at all frequencies comprised in the input signal; and
(d) processing the first, second and third signals to form a first result based on the resistive current;
the first result being in-phase with and proportional to the resistive current,
the processing including forming an intermediate result based on the phase difference between the first result and the second signal.

10. The method of claim 9, the processing including multiplying the intermediate result and the third signal to form a second result based on the capacitive current.

11. The method of claim 10, the second result being proportional to the capacitive current.

12. The method of claim 10, the first result based on summing and low-pass filtering the first signal and the second result.

13. The method of claim 12, the first signal based on a sense resistor in series with the input signal.

14. The method of claim 12, the second signal based on a resistive network coupled to the input signal and ground.

15. The method of claim 12, the third signal based on a capacitor-resistor network coupled to the second signal and ground.

16. The method of claim 9, the resistive current comprising a charging device corona current.

17. The method of claim 9, the input signal comprising a square wave.

18. The method of claim 17, the processing including multiplying the intermediate result and the third signal to form a second result based on the capacitive current.

19. The method of claim 18, the second result being proportional to the capacitive current.

20. The method of claim 18, the first result based on summing and low-pass filtering the first signal and the second result.

21. The method of claim 20, the first signal based on a sense resistor in series with the input signal.

22. The method of claim 20, the second signal based on a resistive network coupled to the input signal and ground.

23. The method of claim 20, the third signal based on a capacitor-resistor network coupled to the second signal and ground.

24. A method of determining a resistive current of a load, the load comprising a capacitive current, the load driven by an input signal, the input signal being sinusoidal, the method comprising:
(a) forming a first signal in-phase with and proportional to the sum of the resistive current and the capacitive current;
(b) forming a second signal in-phase with the input signal;
(c) forming a third signal opposite in phase to the capacitive current; and
(d) processing the first, second and third signals to form a first result based on the resistive current,
wherein:
the first signal is based on a sense resistor in series with the input signal;
the second signal is based on a difference between the first signal and a first ratio signal, the first ratio signal being formed by a resistive divider network coupled between the input signal and the first signal; and
the third signal is based on a difference between the first signal and a second ratio signal, the second ratio signal being formed by a resistor-capacitor divider network coupled between the input signal and the first signal,
and wherein:
the resistance of the sense resistor is much less than the load resistance;
the resistive divider network comprises a first resistor and a series-connected second resistor and the resistance sum of the first resistor and the second resistor is much greater than the load resistance; and
the resistor-capacitor divider network comprises a third resistor and a series-connected capacitor and the resistance of the third resistor is much greater than the load resistance.

25. The method of claim 24, the first result being in-phase with and proportional to the resistive current.

26. The method of claim 24, the processing including forming an intermediate result based on the phase difference between the first result and the second signal.

27. The method of claim 26, the processing including multiplying the intermediate result and the third signal to form a second result based on the capacitive current.

28. The method of claim 27, the second result being proportional to the capacitive current.

29. The method of claim 27, the first result based on summing the first signal and the second result.

30. The method of claim 24, the resistive current comprising a charging device corona current.

31. The method of claim 24, the resistance of the sense resistor being 100 Ohms, the resistance of the first resistor being 10 Meg-Ohms, the resistance of the second resistor being 10 K-Ohms and the resistance of the third resistor being 50 Meg-Ohms.

* * * * *